(12) United States Patent
Han et al.

(10) Patent No.: US 7,348,849 B2
(45) Date of Patent: Mar. 25, 2008

(54) VARIABLE GAIN AMPLIFIER

(75) Inventors: Seon Ho Han, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 93 days.

(21) Appl. No.: 11/497,461

(22) Filed: Aug. 1, 2006

(65) Prior Publication Data

US 2007/0132513 A1    Jun. 14, 2007

(30) Foreign Application Priority Data

Dec. 12, 2005    (KR) ...................... 10-2005-0121442

(51) Int. Cl.
  *H03F 3/45* (2006.01)
  *H03G 3/10* (2006.01)
(52) U.S. Cl. ...................... 330/261; 330/285
(58) Field of Classification Search ...................... None
  See application file for complete search history.

(56) References Cited

U.S. PATENT DOCUMENTS

| | | | |
|---|---|---|---|
| 5,661,437 A * | 8/1997 | Nishikawa et al. | 330/282 |
| 5,757,230 A | 5/1998 | Mangelsdorf | |
| 6,211,737 B1 | 4/2001 | Fong | |
| 6,586,980 B1 * | 7/2003 | Callahan, Jr. | 327/170 |
| 6,621,348 B2 | 9/2003 | Connell et al. | |
| 6,714,081 B1 * | 3/2004 | Xu | 330/296 |
| 6,930,549 B2 | 8/2005 | Kajiwara et al. | |
| 6,965,270 B1 * | 11/2005 | Ross | 330/311 |

2004/0113691 A1    6/2004 Kwon et al.

FOREIGN PATENT DOCUMENTS

| | | |
|---|---|---|
| KR | 10-0356022 | 9/2002 |
| KR | 10-0499856 | 6/2004 |

OTHER PUBLICATIONS

'A Low-Voltage Low-Power Wide-Range CMOS Variable Gain Amplifier' Motamed et al., IEEE Transactions on Circuits and Systems II: Analog and Digital Signal Processing, vol. 45, No. 7, Jul. 1998, pp. 800-811.
'A CMOS IF Transceiver with 90 dB Linear Control VGA for IMT-2000 Application' Youn et al., 2003 Symposium on VLSI Circuit Digest of Technical Papers, pp. 131-134.
'CMOS current-mode pseudo-exponential function circuit' Vlassis, Electronic Letters, Apr. 12, 2001, vol. 37, No. 8, pp. 471-472.

* cited by examiner

*Primary Examiner*—Benny Lee
*Assistant Examiner*—Alan Wong
(74) *Attorney, Agent, or Firm*—Ladas & Parry LLP

(57) ABSTRACT

A complementary metal oxide semiconductor (CMOS) variable gain amplifier has a wider decibel-linear gain variation characteristic with respect to a control voltage when a signal is amplified. The variable gain amplifier includes: a bias input circuit for supplying a current corresponding to a bias voltage; an operation region combination and feedback circuit connected to the bias input circuit and combining at least two amplifiers by feedback in response to a control voltage, each amplifier having a decibel-linear characteristic in saturation and triode regions of a complementary metal oxide semiconductor (CMOS); and a bias output circuit connected to the bias input circuit, and outputting bias current controlled by the operation region combination and feedback circuit.

9 Claims, 4 Drawing Sheets

VARIABLE GAIN AMPLIFIER

CROSS-REFERENCE TO RELATED APPLICATION

This application claims priority to and the benefit of Korean Patent Application No. 2005-121442, filed Dec. 12, 2005, the disclosure of which is incorporated herein by reference in its entirety.

BACKGROUND

1. Field of the Invention

The present invention relates to a variable gain amplifier (VGA), and more particularly, to a complementary metal oxide semiconductor (CMOS) variable gain amplifier having a wider variable gain range than a conventional VGA in the same control voltage variation range.

2. Discussion of Related Art

In general, in a radio frequency (RF) communication transceiver, a receiver has a variable gain amplifier for producing, according to the magnitude of an input signal, a constant signal-to-noise (SNR) characteristic. The variable gain amplifier allows the input signal, whose magnitude in decibels (dB) varies with a distance, to fix the magnitude of a final analog signal of the receiver. Further, the variable gain amplifier serves to provide decibel-linear gain variation with a control voltage in order to make a time taken to perform automatic gain control (AGC) uniform.

An example of the conventional variable gain amplifier is a variable gain amplifier using a bipolar junction transistor (BJT). Owing to the BJT, the variable gain amplifier represents an exponential characteristic of output current depending on input voltage and accordingly, has the advantage of easily obtaining linear-in-dB variable gain.

Another example of the conventional variable gain amplifier is a variable gain amplifier using a complementary metal oxide semiconductor (CMOS). The CMOS variable gain amplifier represents a square law characteristic in which radio frequency input power from a noise level to a −20 dB level is proportional to the square of small signal voltage. Therefore, the CMOS variable gain amplifier generally has a circuit for obtaining a pseudo decibel-linear gain characteristic. However, unlike the variable gain amplifier using the BJT, the CMOS variable gain amplifier has many transistors, and thus has a complicated circuit, high current consumption, a large noise factor, and a considerably large design area.

SUMMARY

The present invention is directed to a complementary metal oxide semiconductor (CMOS) variable gain amplifier, which combines an operation region of the amplifier varied between a saturation region and a triode region while forming a feedback loop within a combination circuit, thereby providing a wider variable gain range in the same control voltage variation range, reducing current consumption, improving a noise factor, and considerably reducing a design area, compared to a conventional CMOS variable gain amplifier.

One aspect of the present invention provides a variable gain amplifier comprising: a bias input circuit for supplying a current corresponding to a bias voltage; an operation region combination and feedback circuit connected to the bias input circuit and combining at least two amplifiers by feedback in response to a control voltage, each amplifier having a decibel-linear characteristic in saturation and triode regions of a complementary metal oxide semiconductor (CMOS); and a bias output circuit connected to the bias input circuit, and outputting bias current controlled by the operation region combination and feedback circuit.

The bias input circuit may comprise a first transistor operating in the saturation region, and having a control terminal to which the bias voltage is applied, a first terminal to which a predetermined voltage is applied, and a second terminal connected to the operation region combination and feedback circuit and the bias output circuit. The operation region combination and feedback circuit may comprise a second transistor having a first terminal to which the current is applied, a control terminal to which the control voltage is applied, and a second terminal; and a third transistor having a first terminal connected to the second terminal of the first transistor, a second terminal, and a control terminal connected to the first terminal of the first transistor. The amplifier may use a current rate in the saturation regions of the first and second transistors, and provide operation and feedback in the triode region using the third transistor.

In the variable gain amplifier, when increase of the control voltage generates a section in which an operation region of the second transistor is in the saturation region and a section in which an operation region of the third transistor is in the triode region, a total gain (Avp) may vary depending on variation of linear control voltage in the following equation:

$$Avp(dB) \approx (-\beta - \alpha) \cdot Vc$$

where β is the slope of decibel-linear gain versus control voltage when there is no third transistor and the second transistor operates in the saturation region, and α is the slope of decibel-linear transconductance of the third transistor versus control voltage.

The variable gain amplifier may further comprise a bias control unit, for example, a resistor connected to the second terminal of the third transistor.

The bias output circuit may comprise a fourth transistor having a first terminal, a second terminal, and a control terminal. The first terminal may be connected to the second terminal of the first transistor and the first terminal of the second transistor, and an input signal may be input to the control terminal.

Another aspect of the present invention provides a variable gain amplifier having a differential structure.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF PREFERRED EMBODIMENTS

Hereinafter, exemplary embodiments of the present invention will be described in detail. However, the present invention is not limited to the exemplary embodiments disclosed below, and can be implemented in various modified forms. Therefore, the present exemplary embodiments are provided for complete disclosure of the present invention and to fully inform the scope of the present invention to those of ordinary skill in the art.

Figure 1:
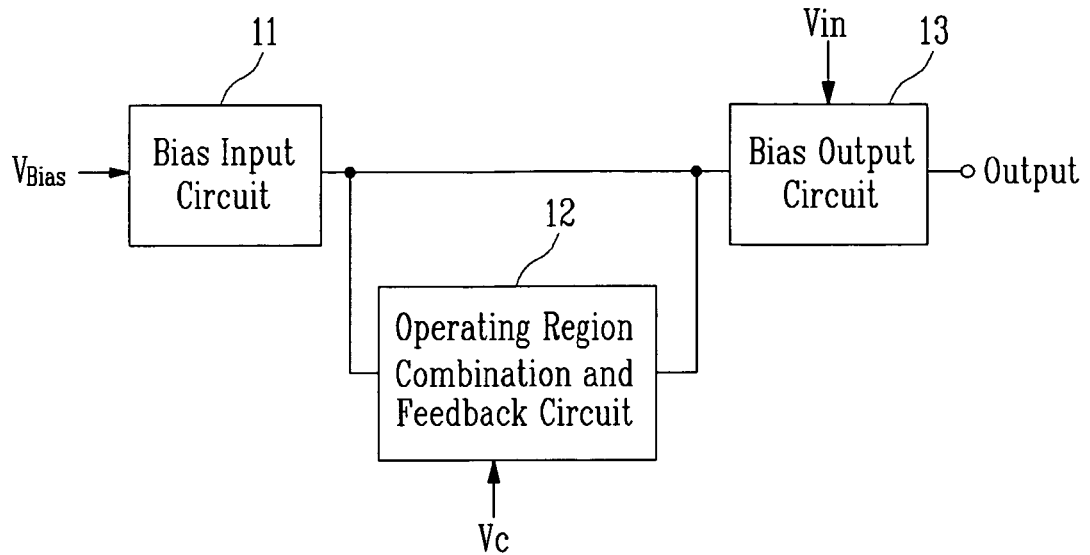
FIG. 1 is a block diagram illustrating a basic construction of a CMOS variable gain amplifier according to the present invention.

FIG. 1 is a block diagram illustrating a basic construction of a complementary metal oxide semiconductor (CMOS) variable gain amplifier according to the present invention.

Basically, the linear-in-dB CMOS variable gain amplifier according to the present invention is to obtain a wider variable gain range by combination of a principle of obtaining a decibel-linear characteristic in a saturation region and a principle of obtaining a decibel-linear characteristic in a triode region. Compared to a conventional CMOS variable gain amplifier, the CMOS variable gain amplifier according to the present invention obtains the wider variable gain range, thereby reducing current consumption, improving a noise factor, and considerably reducing a design area. In the CMOS variable gain amplifier according to the present invention, feedback is a medium for obtaining the wide variable gain range through combination of the triode region and the saturation region. Such a construction is schematically shown in FIG. 1. As illustrated in FIG. 1, the CMOS variable gain amplifier according to the present invention includes a bias input circuit 11 for inputting a bias voltage ($V_{Bias}$), an operation region combination and feedback circuit 12 for combining the saturation region with the triode region of a transistor by a control voltage (Vc), and forming an operation region of the amplifier, and a bias output circuit 13 for outputting current bias whose gain is controlled depending on the voltage bias in response to an input signal (Vin).

Figure 2:
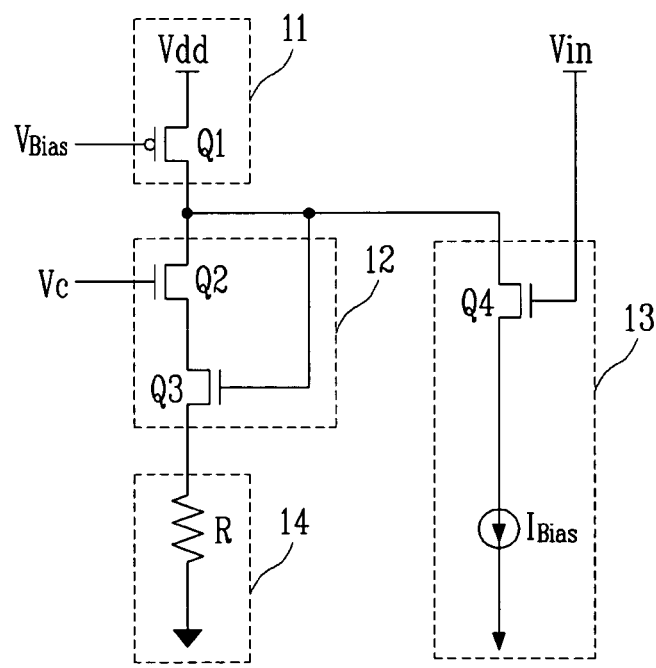
FIG. 2 is a circuit diagram of a CMOS variable gain amplifier according to an exemplary embodiment of the present invention.

FIG. 2 is a circuit diagram of a CMOS variable gain amplifier according to an exemplary embodiment of the present invention.

Referring to FIG. 2, the CMOS variable gain amplifier according to the present invention has a simple structure including four transistors, one of which is a P-type MOS transistor Q1 and the others are N-type MOS transistors Q2, Q3, and Q4.

Specifically, the first transistor Q1 includes a first terminal, a second terminal, and a control terminal. The first terminal is connected to a power source having a predetermined voltage (Vdd), and the bias voltage ($V_{Bias}$) is applied to the control terminal. The first transistor Q1 serves as the bias input circuit 11 for inputting the bias voltage ($V_{Bias}$).

The second transistor Q2 includes a first terminal, a second terminal, and a control terminal. The first terminal is connected to the second terminal of the first transistor Q1, and the control voltage (Vc) is applied to the control terminal. The third transistor Q3 includes a first terminal, a second terminal, and a control terminal. The first terminal is connected to the second terminal of the second transistor Q2. The second terminal is connected to one terminal of a resistor R for optimal bias control. The control terminal is commonly connected to the second terminal of the first transistor Q1 and the first terminal of the second transistor Q2. With the above-mentioned configuration, the second and third transistors Q2 and Q3 serve as the operation region combination and feedback circuit operating in the saturation and triode regions respectively, in response to the control voltage (Vc).

The fourth transistor Q4 includes a first terminal, a second terminal, and a control terminal. The first terminal is commonly connected to the second terminal of the first transistor Q1, the first terminal of the second transistor Q2, and the control terminal of the third transistor Q3. The second terminal is connected to an input terminal of a current source ($I_{Bias}$), and the input signal (Vin) is applied to the control terminal. Owing to the above configuration, the fourth transistor Q4 serves as the bias output circuit 13 for outputting the bias current ($I_{Bias}$) whose gain is controlled by the operation region combination and feedback circuit 12 depending on the bias voltage ($V_{Bias}$), in response to the input signal (Vin). The resistor R serves as a bias control unit 14 that optimally controls bias in a whole circuit obtaining the decibel-linear characteristic.

An operation of the above-described CMOS variable gain amplifier will be described below. First, if the bias voltage ($V_{Bias}$) is applied to the control terminal of the first transistor Q1, the first transistor Q1 of a PMOS type operates in the saturation region, and transmits current corresponding to the bias voltage ($V_{Bias}$). If the control voltage (Vc) is applied to the control terminal of the second transistor Q2, the second transistor Q2 is varied in the operation region by the control voltage (Vc). For example, when the control voltage (Vc) is varied from a high level to a low level, the second transistor Q2 is varied in its operation region from the saturation region to the triode region. The third transistor Q3 is varied in its operation region from the triode region to the saturation region depending on variation of the control voltage (Vc), and its output voltage is feedback and applied to a gate. In view of an output node, the output voltage forms a voltage-current feedback loop.

Figure 3:
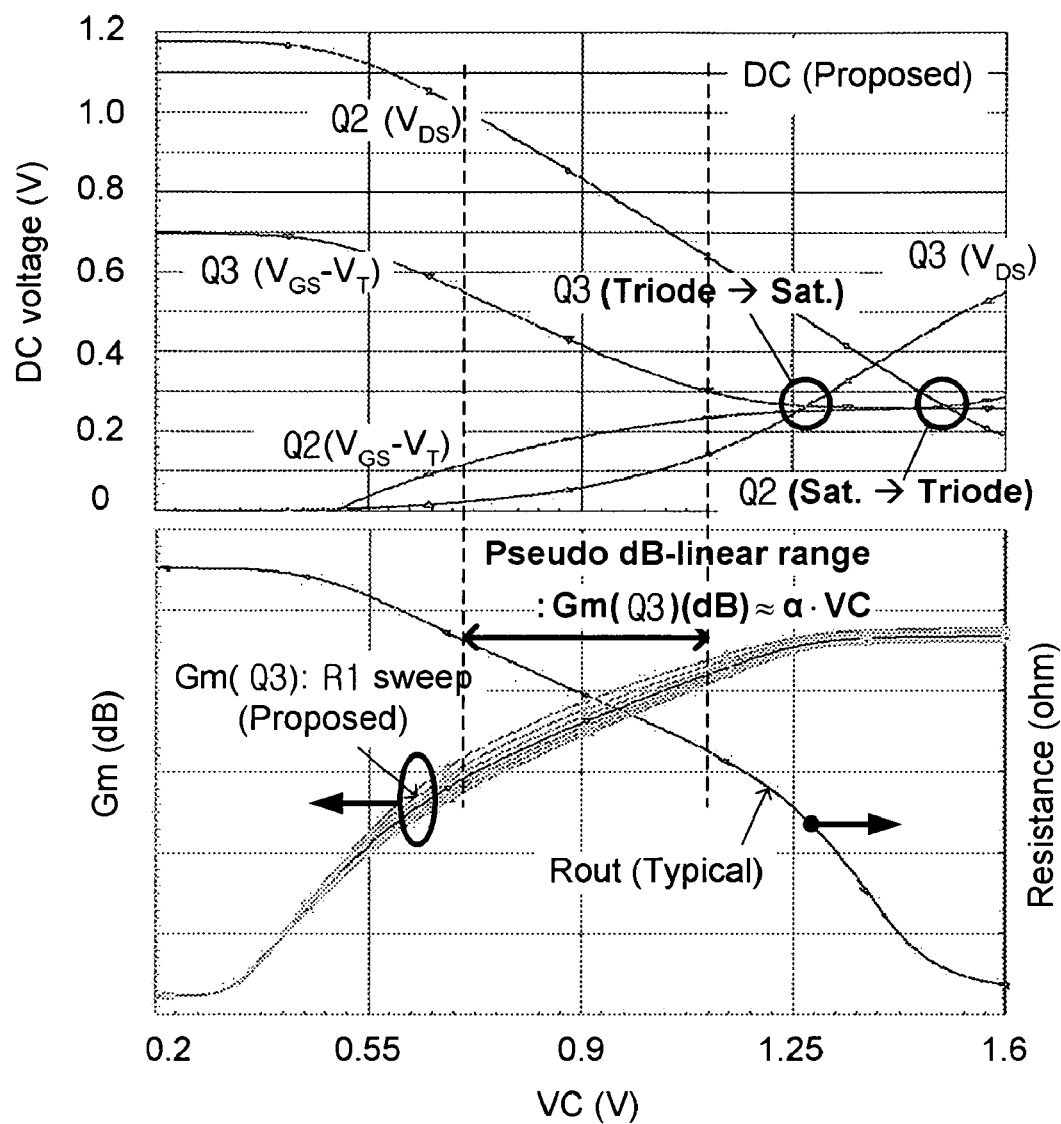
FIG. 3 is a graph showing a simulation result of direct current (DC) characteristics in the circuit of FIG. 2.

FIG. 3 is a graph showing a simulation result of direct current (DC) characteristics in the circuit of FIG. 2.

As shown in FIG. 3, operation regions of the two transistors Q2 and Q3 within the operation region combination and feedback circuit are varied from the saturation region to the triode region or from the triode region to the saturation region depending on the variation of the control voltage (Vc).

Typical output resistance (Rout) represents output resistance upon variation of the control voltage (Vc), and is provided as decibel-linear output resistance to the control voltage (Vc). This is to not only use a current rate in two saturation regions but also obtain a pseudo linear-in-dB gain characteristic by approximation of Equation 1 using the current rate in the two saturation regions.

$$\exp(2nx) \approx ((1+x)/(1-x))^n \quad \text{[Equation 1]}$$

Here, transconductance (Gm) of the third transistor Q3 is expressed as shown in FIG. 3. In other words, when the bias resistance (R) varies depending on the variation of the control voltage (Vc), the transconductance (Gm) of the third transistor Q3 also has a decibel-linear gain characteristic proportional to a certain constant ($\alpha$). As such, the variable gain amplifier represents the decibel-linear gain characteristic in the triode region.

Figure 4:
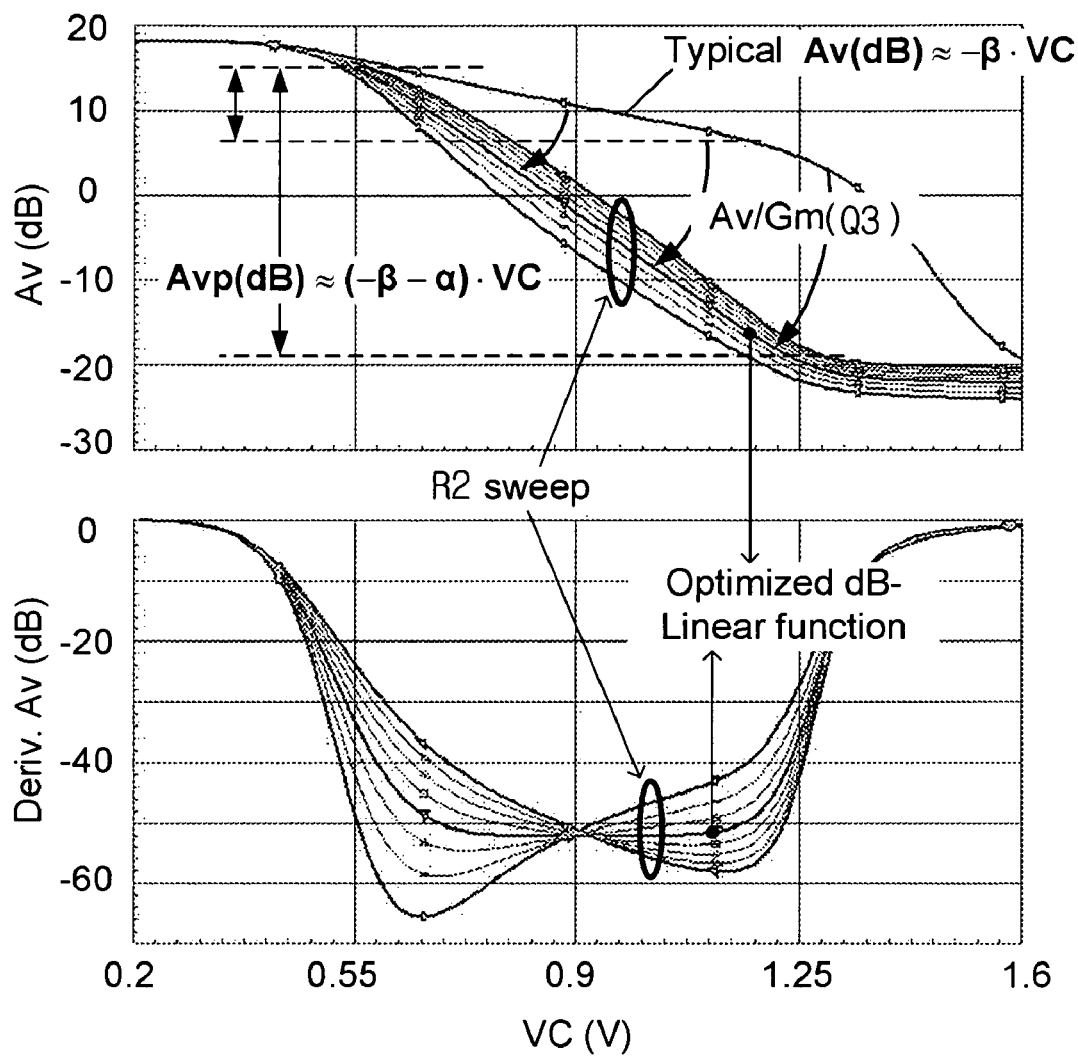
FIG. 4 is a graph showing a simulation result of variable gain characteristics versus control voltage in the circuit of FIG. 2.

FIG. 4 is a graph showing a simulation result of variable gain characteristics versus control voltage in the circuit of FIG. 2.

As shown in FIG. 4, the gain (Av) characteristic is approximately expressed by product of the control voltage and $-\beta$ in a decibel-linear range. This represents a gain caused by decibel-linear output resistance when using two kinds of current of the saturation regions of two transistors Q2 and Q3 of the operation region combination and feedback circuit 12 of FIG. 2. Due to the feedback, the gain (Av) characteristic is divided by the transconductance (Gm) of the third transistor Q3. The transconductance (Gm) of the third transistor Q3 has the decibel-linear gain characteristic in the triode region. Accordingly, a final gain (Avp) of the circuit of FIG. 2 is expressed as in Equation 2. In other words, slope of total gain variation versus same control voltage variation range is increased due to the feedback, thereby increasing a linear-in-dB gain range.

$$Avp(dB) \approx (-\beta - \alpha) \cdot Vc \quad \text{[Equation 2]}$$

where $\beta$ is the slope of decibel-linear gain versus control voltage when there is no third transistor and the second transistor operates in the saturation region, and $\alpha$ is the slope of decibel-linear transconductance of the third transistor versus control voltage.

It can be also appreciated that there is the decibel-linear gain variation when the resistance (R) is varied in FIG. 4.

Figure 5:
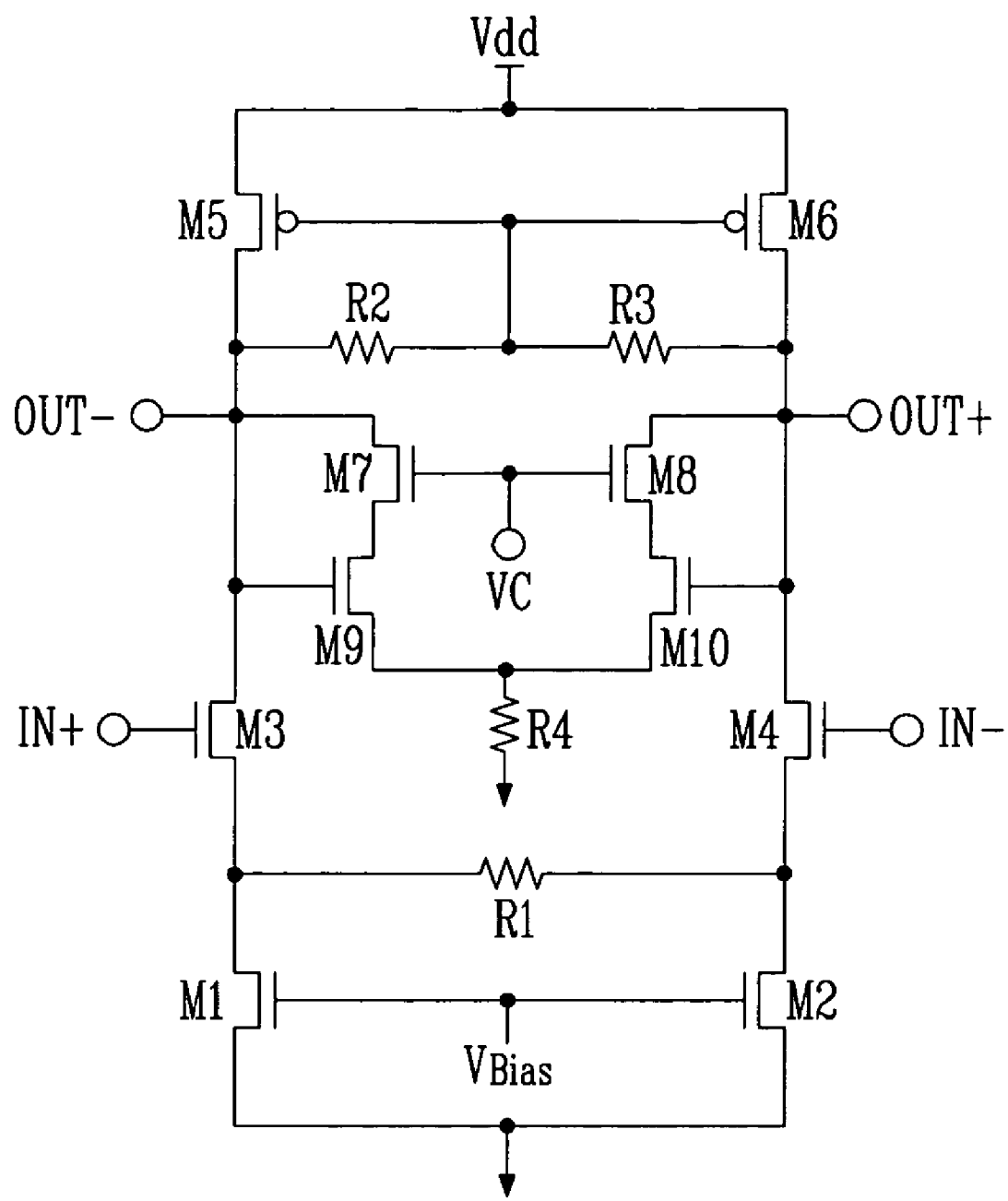
FIG. 5 is a circuit diagram illustrating a CMOS variable gain amplifier of a differential structure according to another exemplary embodiment of the present invention.

FIG. 5 is a circuit diagram illustrating a CMOS variable gain amplifier of a differential structure according to another exemplary embodiment of the present invention.

Referring to FIG. 5, the CMOS variable gain amplifier having the differential structure includes two PMOS transistors M1 and M2 and eight NMOS transistors M3 to M10, and the variable gain amplifier circuit of FIG. 2 can be differentially embodied.

The first and second transistors M1 and M2 each include a first terminal, a second terminal, and a control terminal. The first terminals are connected to both terminals of a first resistor R1, respectively. The respective second terminals are commonly connected to a ground. The bias voltage ($V_{Bias}$) is commonly connected to the respective control terminals. Basically, the first resistor R1 is to improve linearity of a process signal in the differential structured circuit. When a resistor of the differential structured circuit is substituted using a metal oxide semiconductor (MOS), the gain can be discretely controlled as well.

The third and fourth transistors M3 and M4 each include a first terminal, a second terminal, and a control terminal. The second terminals are connected to the first terminals of the first and second transistors M1 and M2, respectively. Two input signals (IN+ and IN−) are applied to the control terminals, respectively.

The fifth and sixth transistors M5 and M6 each include a first terminal, a second terminal, and a control terminal. The first terminals are commonly connected to the power source having the predetermined voltage (Vdd). The second terminals are connected to the first terminals of the third and fourth transistors M3 and M4, respectively. The respective control terminals are commonly connected with each other. A second resistor R2 is connected between the control terminal and the second terminal of the third transistor M3. A third resistor R3 is connected between the control terminal and the second terminal of the fourth transistor M4. The second and third resistors R2 and R3 for common mode negative feedback set self-output bias voltages.

The seventh and eighth transistors M7 and M8 each include a first terminal, a second terminal, and a control terminal. The first terminals are connected to the second terminals of the fifth and sixth transistors M5 and M6, respectively. The respective control terminals are commonly connected with each other, and the control voltage (Vc) is commonly applied to the respective control terminals.

The ninth and tenth transistors M9 and M10 each include a first terminal, a second terminal, and a control terminal. The first terminals are connected to the second terminals of the seventh and eighth transistors M7 and M8, respectively. The second terminals are commonly connected to one terminal of the fourth resistor R4. The control terminals are connected to a connection point of the third and fifth transistors M3 and M5 and a connection point of the fourth and sixth transistors M4 and M6, respectively. The fourth resistor R4 serves to control the bias in the whole circuit obtaining the decibel-linear characteristic. The connection point of the third and fifth transistors M3 and M5 and the connection point of the fourth and sixth transistors M4 and M6 are two output points (OUT+ and OUT−).

Among the first to tenth transistors, the fifth and sixth transistors are PMOS transistors, and the first to fourth transistors and the seventh to tenth transistors are NMOS transistors.

The variable gain amplifier according to the second exemplary embodiment of the present invention has great advantageous effect of eliminating the common mode noise, compared to the variable gain amplifier according to the first exemplary embodiment of the present invention.

As described above, the variable gain amplifier according to the present invention can have the wider variable gain range for the same control voltage variation range, provide low current consumption, improve the noise factor, and embody a simple structure in which the design area is considerably reduced, compared to the conventional CMOS variable gain amplifier.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A variable gain amplifier comprising:
   a bias input circuit for supplying a current corresponding to a bias voltage;
   an operation region combination and feedback circuit connected to the bias input circuit and combining at least two amplifiers by feedback in response to a control voltage, each amplifier having a decibel-linear characteristic in saturation and triode regions of a complementary metal oxide semiconductor (CMOS); and
   a bias output circuit connected to the bias input circuit, and outputting bias current controlled by the operation region combination and feedback circuit.

2. The amplifier according to claim 1, wherein the bias input circuit comprises a first transistor operating in the saturation region, and having a control terminal to which the bias voltage is applied, a first terminal to which a predetermined voltage is applied, and a second terminal connected to the operation region combination and feedback circuit and the bias output circuit.

3. The amplifier according to claim 2, wherein the operation region combination and feedback circuit comprises:
   a second transistor having a first terminal to which the current is applied, a control terminal to which the control voltage is applied, and a second terminal; and
   a third transistor having a first terminal connected to the second terminal of the second transistor, a second terminal, and a control terminal connected to the first terminal of the second transistor.

4. The amplifier according to claim 3, wherein the amplifier makes use of a current rate in the saturation regions of the first and second transistors, and provides operation and feedback in the triode region using the third transistor.

5. The amplifier according to claim 3, wherein, when increase of the control voltage generates a section in which an operation region of the second transistor is in the saturation region and a section in which an operation region of the third transistor is in the triode region, a total gain (Avp) varies depending on variation of linear control voltage in the following equation:

$$Avp(dB) \approx (-\beta - \alpha) \cdot Vc$$

where $\beta$ is the slope of decibel-linear gain versus control voltage when there is no third transistor and the second transistor operates in the saturation region, and $\alpha$ is the slope of decibel-linear transconductance of the third transistor versus control voltage.

6. The amplifier according to claim 3, further comprising a bias control unit connected to the second terminal of the third transistor.

7. The amplifier according to claim 6, wherein the bias control unit is a resistor.

8. The amplifier according to claim 3, wherein the bias output circuit comprises a fourth transistor having a first terminal, a second terminal, and a control terminal, the first terminal being connected to the second terminal of the first transistor and the first terminal of the second transistor, and an input signal being input to the control terminal.

9. The amplifier according to claim 3, wherein the amplifier has a differential structure.

* * * * *